United States Patent
Jain et al.

(10) Patent No.: US 11,270,890 B2
(45) Date of Patent: Mar. 8, 2022

(54) ETCHING CARBON LAYER USING DOPED CARBON AS A HARD MASK

(71) Applicant: Lam Research Corporation, Fremont, CA (US)

(72) Inventors: Amit Jain, Mountain View, CA (US); Anne Le Gouil, Fremont, CA (US); Yasushi Ishikawa, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/220,439

(22) Filed: Dec. 14, 2018

(65) Prior Publication Data

US 2020/0194272 A1 Jun. 18, 2020

(51) Int. Cl.
| | |
|---|---|
| *H01L 21/308* | (2006.01) |
| *H01L 21/04* | (2006.01) |
| *H01L 21/311* | (2006.01) |
| *H01L 21/3213* | (2006.01) |
| *H01L 21/033* | (2006.01) |
| *H01L 21/3065* | (2006.01) |

(52) U.S. Cl.
CPC ...... *H01L 21/3081* (2013.01); *H01L 21/0332* (2013.01); *H01L 21/042* (2013.01); *H01L 21/308* (2013.01); *H01L 21/3065* (2013.01); *H01L 21/3086* (2013.01); *H01L 21/31116* (2013.01); *H01L 21/31144* (2013.01); *H01L 21/32136* (2013.01)

(58) Field of Classification Search
None
See application file for complete search history.

(56) References Cited

U.S. PATENT DOCUMENTS

| | | | | |
|---|---|---|---|---|
| 9,852,923 | B2 | 12/2017 | Lee et al. | |
| 2002/0037648 | A1* | 3/2002 | Nishizawa | H01L 21/3065 438/689 |
| 2005/0082606 | A1* | 4/2005 | Grunow | H01L 23/5329 257/330 |
| 2005/0255702 | A1* | 11/2005 | Honeycutt | H01L 21/0332 438/725 |

(Continued)

FOREIGN PATENT DOCUMENTS

KR 10-2017-0093003 8/2017

OTHER PUBLICATIONS

PCT International Search Report and Written Opinion dated Apr. 7, 2020 issued in Application No. PCT/US2019/065552.

(Continued)

*Primary Examiner* — Jiong-Ping Lu
(74) *Attorney, Agent, or Firm* — Weaver Austin Vileneuve & Sampson LLP

(57) ABSTRACT

Methods for etching features into carbon material using a metal-doped carbon-containing hard mask to reduce and eliminate redeposition of silicon-containing residues are provided herein. Methods involve depositing a metal-doped carbon-containing hard mask over the carbon material prior to etching the carbon material, patterning the metal-doped carbon-containing hard mask, and using the patterned metal-doped carbon-containing hard mask to etch the carbon material such that the use of a silicon-containing mask during etch of the carbon material is eliminated.

18 Claims, 8 Drawing Sheets

(56) References Cited

U.S. PATENT DOCUMENTS

| | | |
|---|---|---|
| 2012/0080779 A1 | 4/2012 | Seamons et al. |
| 2013/0109188 A1* | 5/2013 | Kim ................ H01L 21/32139 |
| | | 438/710 |
| 2015/0064914 A1 | 3/2015 | Kong et al. |
| 2015/0087154 A1* | 3/2015 | Guha ............... H01L 21/31144 |
| | | 438/703 |
| 2016/0027614 A1 | 1/2016 | Manna et al. |
| 2016/0282721 A1* | 9/2016 | Seol ...................... G03F 7/094 |
| 2016/0293430 A1* | 10/2016 | Choi ................. H01L 21/31116 |
| 2017/0084467 A1* | 3/2017 | Oomori ............ H01L 21/31122 |
| 2017/0365487 A1* | 12/2017 | Shen .................... C23C 16/402 |
| 2018/0074409 A1 | 3/2018 | Vaniapura et al. |
| 2018/0082940 A1 | 3/2018 | Sorenson et al. |
| 2019/0172714 A1* | 6/2019 | Bobek ............... H01L 21/02274 |

OTHER PUBLICATIONS

Moore, et al. "Mechanical Characterization of Low-K Dielectric Materials," AIP Conference Proceedings 550, 431 (2001), 9 pages.
PCT International Preliminary Report on Patentability and Written Opinion dated Jun. 8, 2021 issued in Application No. PCT/US2019/065552.

* cited by examiner

ETCHING CARBON LAYER USING DOPED CARBON AS A HARD MASK

BACKGROUND

Semiconductor fabrication processes often involve etching carbon-containing material using a mask. However, as devices shrink, and technology advances, it is challenging to etch carbon-containing materials using existing hard masks without affecting the profile of the pattern to be etched into the carbon-containing materials.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods for processing semiconductor substrates are provided herein. One aspect involves a method including: providing a substrate including a substantially dopant-free carbon-containing layer to be etched; forming a patterned metal-doped carbon-containing layer over the substantially dopant-free carbon-containing layer; and etching the substantially dopant-free carbon-containing layer using the patterned metal-doped carbon-containing layer to form a patterned substantially dopant-free carbon-containing layer.

In various embodiments, the patterned metal-doped carbon-containing layer is silicon-free.

In various embodiments, forming the patterned metal-doped carbon-containing layer includes forming a patterned mask of a metal-doped carbon-containing layer and etching the metal-doped carbon-containing layer using the patterned mask to form the patterned metal-doped carbon-containing layer. The patterned mask may be formed by depositing a mask material over the metal-doped carbon-containing layer, developing a patterned resist over the mask material, and etching the mask material relative to the metal-doped carbon-containing layer using the patterned resist. The method may also include, prior to etching the substantially dopant-free carbon-containing layer, removing the patterned mask. In some embodiments, the patterned mask includes silicon. For example, the patterned mask may be silicon oxycarbide or silicon oxynitride. In some embodiments, the ratio of the thickness of the patterned mask to the thickness of the metal-doped carbon-containing layer is between about 1:5 and about 1:7.

In some embodiments, the etching of the substantially dopant-free carbon-containing layer consumes substantially all of the patterned mask.

In various embodiments, the metal-doped carbon-containing layer comprises a metal dopant, the metal dopant selected from the group consisting of boron, titanium, tungsten, tantalum, tin, aluminum, and combinations thereof.

In various embodiments, dopant concentration of the metal in the patterned metal-doped carbon-containing layer is between about 40% and about 60%.

The patterned metal-doped carbon-containing layer includes feature having feature openings with a width between about 16 nm and about 120 nm.

In various embodiments, etch rate of the substantially dopant-free carbon-containing layer during the etching of the substantially dopant-free carbon-containing layer is at least about three times faster than etch rate on the patterned metal-doped carbon-containing layer.

The ratio of the thickness of the metal-doped carbon-containing layer to the thickness of the substantially dopant-free carbon-containing layer may be between about 1:5 and about 1:8.

In various embodiments, the etching of the metal-doped carbon-containing layer is performed using a bias. For example, the bias power may be at least about 1000V.

In some embodiments, the ellipticity of features formed in the patterned substantially dopant-free carbon-containing layer after the etching of the substantially dopant-free carbon-containing layer is between about 0.67 and about 1.03.

The etching may be performed using one or more gases that form volatile byproducts with the metal-doped carbon-containing layer and substantially dopant-free carbon-containing layer without redepositing material onto substrate surfaces.

In various embodiments, the substantially dopant-free carbon-containing layer is etched to form features having a critical dimension between about 50 nm and about 120 nm.

In some embodiments, the substantially dopant-free carbon-containing layer is etched to form features having a critical dimension between about 16 nm and about 22 nm.

In various embodiments, the metal-doped carbon-containing layer is doped with boron and the etching of the substantially dopant-free carbon-containing layer is performed in a silicon-free environment.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes involve fabrication of memory and logic devices. Examples include 3D NAND and dynamic random-access memory (DRAM) applications, as well as logic applications for mid end of line (MEOL) and back end of line (BEOL) processes. Fabrication of memory and logic devices often involve etching features, such as contact holes, on a substrate, which may include one material or multiple layers of material some of which may be semiconductor material. "Features" such as via or contact holes may be characterized by one or more of narrow and/or re-entrant openings, constrictions within the feature, and high aspect ratios. The term "feature" as described herein refers to negative features such as holes or vias. Etching features, in many cases, involves depositing and patterning a hard mask over the material to be etched, and etching the material using the hard mask as a pattern. The patterned hard mask may eventually be removed from the substrate.

Some fabrication methods of semiconductor devices involve etching of an amorphous carbon material using a hard mask. In some methods, a silicon-containing hard mask is used as a mask when etching amorphous carbon. For example, a silicon oxynitride or silicon oxide hard mask may be used. An example is provided in FIG. 1A, which shows a substrate 101 having an amorphous carbon layer 103, a silicon oxynitride hard mask 105, and patterned resist 107. In various embodiments, the patterned resist 107 is formed by depositing photoresist material, such as carbon material, and developing the photoresist material using photolithography techniques.

Figure 1A:
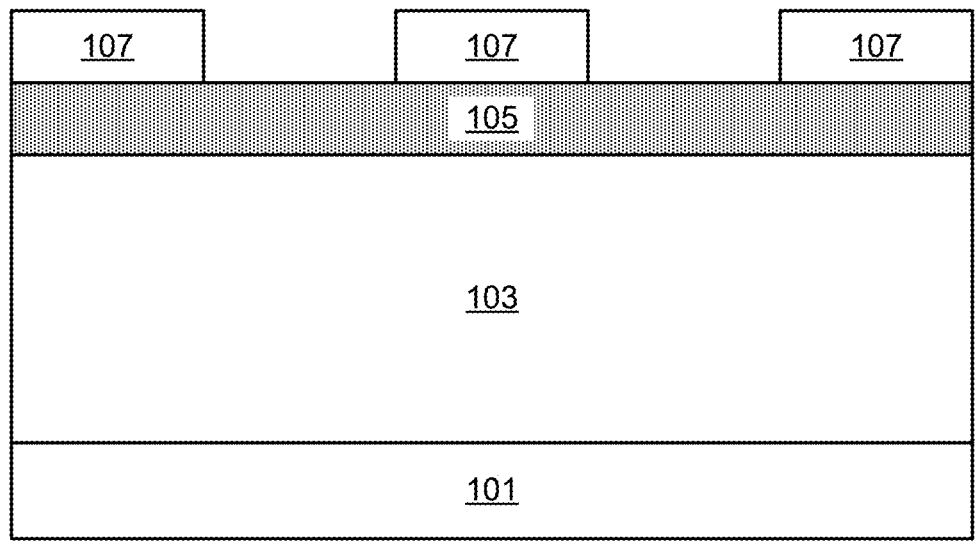
FIGS. 1A-1C provide schematic illustrations of a substrate undergoing etching operations.
Figure 1B:
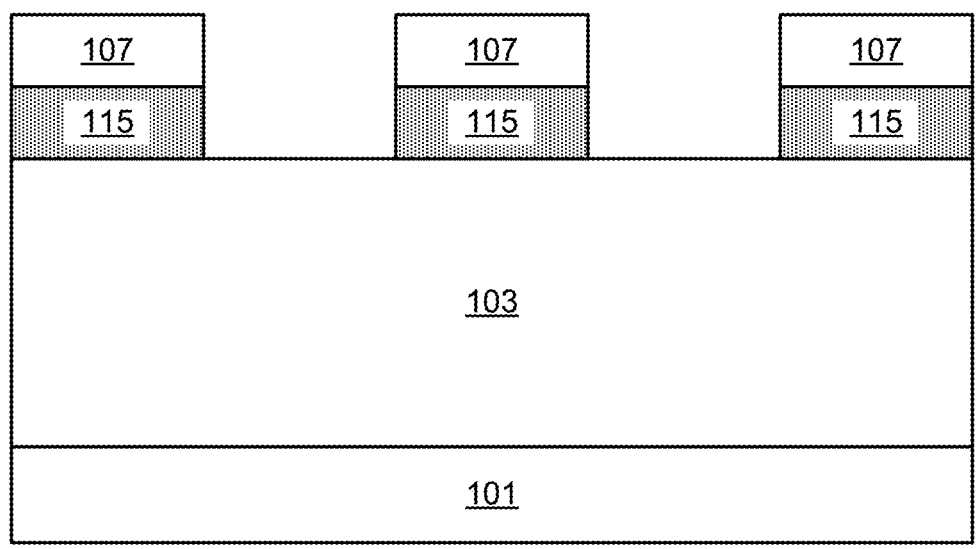
Figure 1C:
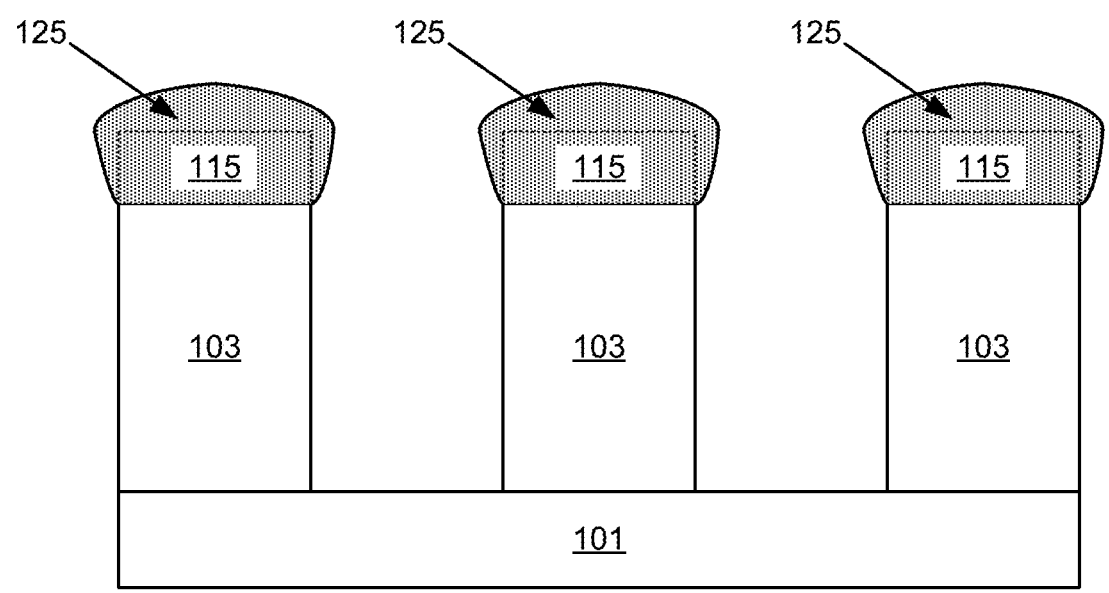

In FIG. 1B, the silicon oxynitride hard mask 105 is etched using the pattern of the patterned resist 107 to form patterned silicon oxynitride hard mask 115. In FIG. 1C, the amorphous carbon layer 103 is etched using the pattern of the patterned silicon oxynitride hard mask 115. However, because the amorphous carbon layer 103 is exposed to etchants for a long duration using etch chemistries that may form non-volatile byproducts with silicon, non-volatile etch residues 125 (such as silicon oxide residues) redeposit onto the tops of the features over the patterned silicon oxynitride hard mask 115, which reduces the critical dimension of features between the etched amorphous carbon 113. Redeposition may result in increased thickness of up to 20 nm on the sidewalls of the features, which in various embodiments may be thick enough to close off the entire feature opening. This may occur while some thickness of silicon oxynitride hard mask 115 remains on the substrate, the thickness of which may be slightly reduced due to some etching of the silicon oxynitride hard mask 115 by the etchants. This results in critical dimension variation of features across the wafer.

As shown, the presence of silicon in the hard mask during etching of the amorphous carbon material may cause degradation resulting in increased local critical dimension variation. Some of these methods may result in mask faceting, circularity issues, ellipticity of features, line width roughness, space width roughness, and feature twisting.

Ellipticity of features is measured by dividing the major diameter by the minor diameter. A perfectly circular feature will have an ellipticity of 1. The redeposition of silicon-containing materials onto tops of features can cause the ellipticity of features to be about 1.16 or greater. However, using certain disclosed embodiments described herein, ellipticity of features may be between about 0.67 to about 1.03.

Variation of critical dimension in one direction can cause feature twisting, which can ultimately result in a short or etching issues later on. For example, undesirable high critical dimension variation can result in an unopened ONON gate edge after opening the mask, thereby causing issues on the device.

In some methods, etching using a silicon-containing hard mask results in redeposition of non-volatile silicon or silicon-containing etch residues, such as silicon oxide residues, at or near feature openings, thereby degrading the profile of the features to be etched and causing defects on the substrate. In some embodiments, the silicon oxide residue buildup may be so large so as to completely close the feature, rendering the substrate useless. Such processes may result in reduced or limited device performance, or yield loss of devices.

Provided herein are methods of incorporating a doped carbon-containing film as a hard mask during patterning schemes to reduce the thickness of a silicon-containing hard mask used over a carbon layer, which may be undoped, when etching the carbon layer having a large thickness. The doped carbon-containing film may be doped using one or more dopants, including metal dopants. The doped carbon-containing film may be referred to herein as a doped amorphous carbon film in some embodiments. In various embodiments, the doped carbon-containing film is used as a hard mask over an undoped carbon film.

Certain disclosed embodiments may be used in applications for manufacturing semiconductor devices such as memory devices and logic devices. The doped carbon-containing film may be a metal-doped carbon-containing film. Example metal dopants include boron, tungsten, titanium, tantalum, aluminum, tin, other metallic compounds, and combinations thereof. The amount of dopant in a doped carbon-containing film may vary. In some embodiments, the amount of dopant in the doped carbon-containing film may be greater than 0% and any amount less than 99%. Dopant concentration used depends on the type of metal being used as a dopant. In some embodiments, boron is the metal dopant. In various embodiments, using a doped carbon-containing film having a dopant concentration of between about 30% and about 70%, or between about 40% and about 60%, or between about 50% and about 70%, or between about 50% and about 60%, or between about 45% and about 55% yielded particularly better performance of maintaining the etch profile and preventing redeposition of etch residues on the substrate surface.

Dopant concentration can affect the etch selectivity of the metal-doped carbon-containing film relative to an underlying carbon-containing film. A lower dopant concentration having a lower etch selectivity can be deposited to a thicker thickness to accommodate the lower etch selectivity depending on the amount of carbon-containing film to be etched underlying the metal-doped carbon-containing film. An example of the relationship between etch selectivity and dopant concentration is described in further detail in the experiment described below with respect to FIG. 6.

Figure 2:
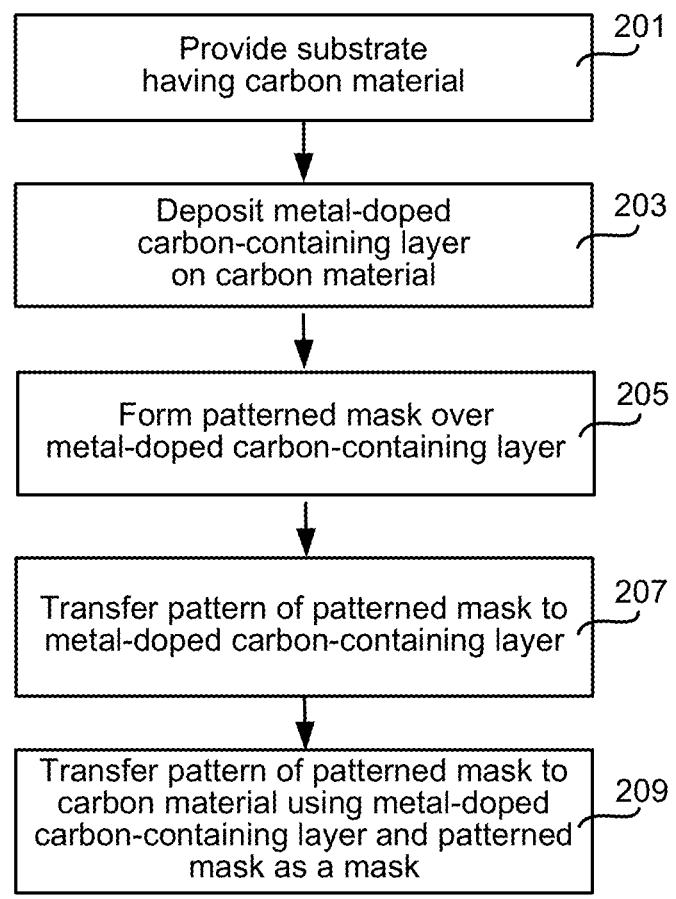
FIG. 2 is a process flow diagram depicting operations performed in accordance with certain disclosed embodiments.

FIG. 2 is a process flow diagram showing an example method for performing operations in accordance with certain disclosed embodiments. In operation 201, a substrate having carbon material and a patterned mask over the carbon material is provided. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In various embodiments, the substrate is patterned. A patterned substrate may have "features" such as pillars, poles, trenches, via or contact holes, which may be characterized by one or more of narrow and/or re-entrant openings, constrictions within the feature, and high aspect ratios. The feature(s) may be formed in one or more of the above described layers. In some embodiments, a feature may be formed on one or more of the top most layers of a substrate such that the bottom of the feature is an exposed underlayer. One example of a feature is a pillar or pole in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In various embodiments, the substrate includes carbon material such as amorphous carbon material. The amorphous carbon material may be a blanket layer having no features etched thereon. In many embodiments, carbon material underlying the metal-doped carbon-containing film has a metal content of 0%. In various embodiments this amorphous carbon material may be the material to be ultimately etched after forming appropriate hard masks over it with the desired pattern. The carbon material is substantially dopant-free, which is defined such that a substantially dopant-free carbon material includes materials with very low amounts of dopant, such as having a dopant concentration in the carbon material less than about 1%, or about 0%, or 0%. In some embodiments, the carbon material includes trace amounts of hydrogen and/or nitrogen. Trace amounts may refer to a content of less than about 40% or less than about 30% or less than about 15% in the carbon material. The carbon material may also vary in hardness such as material having a hardness between about 8 and about 12. The carbon material may also having any suitable modulus, such as between about 60 and about 160 GPa. In some embodiments, the percentage of sp3 bonds in the carbon material may be between about 15% and about 50%.

In various embodiments, the amorphous carbon material is between about 50 nm and about 500 nm thick for 3D NAND applications. The critical dimension of features to be etched in the amorphous carbon material depends on the application. In some embodiments, the features have a critical dimension between about 50 nm and about 120 nm for 3D NAND applications. In some embodiments, the features have a critical dimension between about 16 nm and about 22 nm for DRAM applications.

In operation 230, a metal-doped carbon-containing layer is deposited on the carbon material. The ratio of the thickness of the metal-doped carbon-containing layer to the thickness of the carbon material may be between about 1:5 and about 1:8. In various embodiments, the metal-doped carbon-containing layer is deposited directly on the carbon material. A metal-doped carbon-containing layer may be referred to as a metal-doped carbon-containing hard mask or metal-doped amorphous carbon hard mask. The metal-doped carbon-containing layer is silicon-free. Examples of forming metal-doped carbon-containing hard masks are described in U.S. Pat. No. 9,520,295, which is incorporated by reference herein for all purposes. Metal-doped carbon-containing hard masks include metal atoms and carbon atoms, which may be cross-linked. In some embodiments, metal-doped carbon-containing hard masks having tungsten include cross-linking between tungsten carbide and additional carbon and hydrogen atoms, or between tungsten carbide and additional carbon atoms, or between tungsten carbide and additional hydrogen atoms. The different types of cross-linking observed in a metal-doped carbon-containing hard mask depends on the process conditions for depositing the hard mask, such as deposition precursor chemistry, temperature, chamber pressure, and plasma conditions.

Some metal-doped carbon-containing hard masks may be formed by plasma-enhanced chemical vapor deposition (PECVD) by introducing a hydrocarbon precursor gas to a processing chamber and introducing a metal-based precursor gas to a processing chamber and igniting a plasma to deposit the metal-doped carbon-containing hard mask on a substrate. Hydrocarbon precursors may have the chemical formula $C_xH_y$, where x is an integer from 2 to 10 and y is an integer from 2 to 24. Examples include methane, acetylene, ethylene, propylene, butane, cyclohexane, benzene, and toluene. The metal-based precursor gas may be a metal halide precursor gas. Metal halide precursor gases include tungsten fluorides ($WF_a$), titanium chlorides ($TiCl_b$), tungsten chlorides ($WCl_c$), hafnium chlorides ($HfCl_d$), and tantalum chlorides ($TaCl_e$), where a, b, c, d, and e are integers greater than or equal to 1. Examples include tetrakis(dimethylamino)titanium (TDMAT) and bis(tert-butylimido)-bis-(dimethylamido)tungsten (BTBMW). During deposition of a metal-doped carbon-containing hard mask, a carrier gas may be flowed, such as hydrogen, argon, nitrogen, helium, or combinations thereof. Dopants for metal-doped carbon-containing hard masks include but are not limited to tungsten, titanium, hafnium, and tantalum. In some embodiments, the metal dopants may be any one or more of transition metals in Period 6 of the Periodic Table of Elements. In some embodiments, the dopant is any of tungsten, titanium, tantalum, nitrides thereof, and combinations thereof. For example, in some embodiments the dopant is a tungsten nitride, or a tungsten silicide. The dopant is not a silicide. In various embodiments, the dopant is not silicon, or is silicon-free.

Metal-doped carbon-containing layers protect the underlying carbon-containing layer when etching high aspect ratio holes as they have a higher film density and can withstand etching chemistries used to form the high aspect ratio features without damaging or removing the hard mask as compared to non-doped carbon-containing hard masks. Metal-doped hard masks do not include contain metalloids. Silicon-free metal-doped carbon-containing layers prevent the formation of silicon-containing residues at the tops of features, thereby preserving the feature profiles.

In operation 205, a patterned mask is formed over the metal-doped carbon-containing layer. The patterned mask may be formed by depositing a mask layer over the blanket layer of metal-doped carbon-containing material and etching or lithographically defining the mask relative to the metal-doped carbon-containing layer using a patterned photoresist or by double patterning techniques. The mask material is a silicon-containing material such as silicon oxide. In various embodiments, the patterned mask is silicon oxynitride (SiON). In various embodiments, the patterned mask includes both silicon oxynitride and silicon oxide. The patterned mask material is selected to etch the metal-doped carbon-containing layer to form a pattern such that the metal-doped carbon-containing layer can be used as a mask to etch the underlying carbon material. The patterned mask is, in various embodiments, an SiON layer having a particular thickness and is deposited in accordance to industry standards.

The thickness of the patterned mask is selected such that enough patterned mask is present to open the metal-doped carbon-containing material. The ratio of the thickness of the patterned mask to the thickness of the metal-doped carbon-containing material may be between about 1:5 and about 1:7.

The mask material may be any of those described above with respect to operation 105 and 115 of FIGS. 1A and 1B respectively. The mask may be etched using a halogen-containing and oxygen-containing etching species. Example halogen-containing gases used include, but are not limited to, chlorine, fluorine, nitrogen trifluoride, and boron trifluoride. Example oxygen-containing etching species include, but are not limited to, carbon monoxide, carbon oxysulfide, sulfur oxide, and oxygen.

Figure 3A:
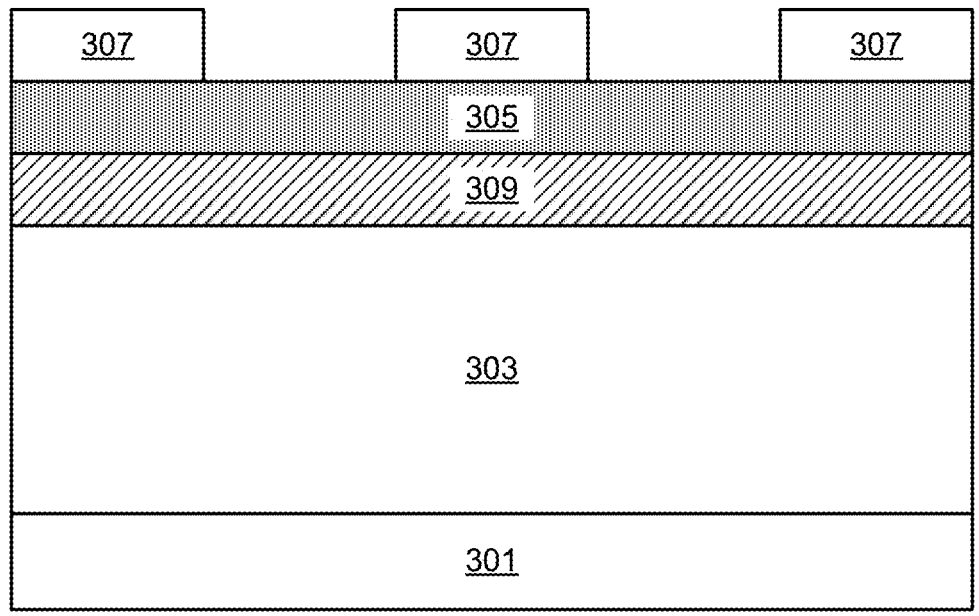
FIGS. 3A-3D are schematic illustrations of substrates undergoing operations of certain disclosed embodiments.
Figure 3B:
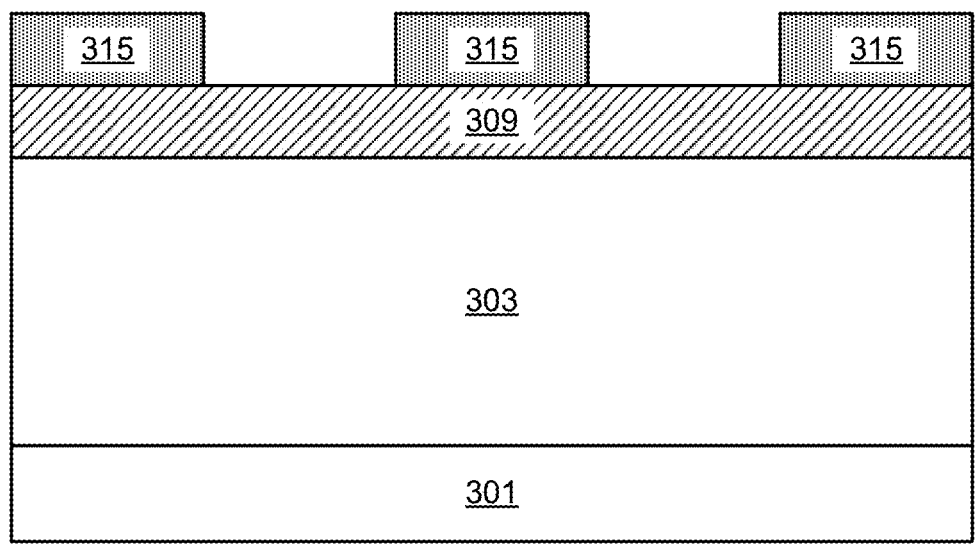

FIG. 3A shows an example schematic illustration of a substrate 301 with an amorphous carbon layer 303, metal-doped carbon-containing layer 309, mask material 305, and developed photoresist 307. In some embodiments, developed photoresist 307 may represent a mask formed using double patterning techniques. FIG. 3B shows a patterned mask material 315 after etching the mask material 305 in FIG. 3A using the developed photoresist 307 as a mask, using selective etching relative to the metal-doped carbon-containing material 309. Such etching of the mask material 305 may be performed by plasma etching using the patterned resist as a mask. Since the metal-doped carbon-containing layer is used as a primary mask for protecting the underlying carbon material, the mask material is deposited to a thickness dependent on the thickness of the metal-doped carbon-containing layer, the thickness of which depends on the amorphous carbon layer.

Returning to FIG. 2, in operation 207, the pattern of the patterned mask is transferred to the metal-doped carbon-containing layer. In various embodiments, in operation 207 the pattern is transferred using etching chemistry such that the metal-doped carbon-containing layer is etched using the patterned mask as a mask thereby transferring the pattern to the metal-doped carbon-containing layer. In various embodiments, etching in operation 207 is selective to the underlying carbon material. For example, the etch rate on the carbon material may be at least about 2 or about 3 times slower than the etch rate on the metal-doped carbon-containing layer. If the patterned mask material is a silicon oxynitride film, the patterned mask may be transferred to the metal-doped carbon-containing layer by exposing the substrate to an etching chemistry that may include but is not limited to exposure to a gas mixture including at least a halogen-containing gas and an oxygen-containing gas in a plasma environment. For example, in some embodiments, the halogen-containing gas may include chlorine, fluorine, boron chloride, boron fluoride, tungsten chlorides, and tungsten fluorides. The oxygen-containing gas may be oxygen. In some embodiments, the gas mixture includes chlorine, fluorine, oxygen, nitrogen, and dilute argon and hydrogen gas. The gas mixture used to etch the metal-doped carbon-containing material depends on the dopant concentration in the metal-doped carbon-containing material. That is, in some embodiments, the ratio of chlorine to fluorine may be higher for highly doped metal-doped carbon-containing materials.

One skilled in the art will recognize that the actual species present in the plasma may be a mixture of different ions, radicals, and molecules derived from the etching gases. It is noted that other species may be present in the reaction chamber during the removal of the metal-doped carbon-containing material, such as the volatile by-products as the plasma reacts with and breaks down the metal-containing carbon-containing material. The initial one or more gases introduced into the plasma may be different from the one or more gases that exist in the plasma as well as the one or more gases that contact the surface of the substrate during etching.

Various types of plasma sources may be used including RF, DC, and microwave based plasma sources. In some embodiments, an RF plasma source is used. Typically, the RF plasma power for a 300 mm wafer ranges between about 500W and about 10000W, or between about 3000W and about 10000W. In some embodiments, the power is about 7000W per station. Depending on the process chamber being used, in some embodiments, each station has a dedicated power source. In various embodiments, the plasma is generated as an inductively coupled plasma upstream of the showerhead.

In various embodiments, a bias is not applied to the pedestal during etching of the metal-doped carbon-containing material. However, in some embodiments, an RF bias is used. An RF bias may be used in some embodiments. Various types of RF biases may be used; for example, RF bias may be generated at a frequency of 13.56 MHz, or lower, including but not limited to 400 MHz, 2 MHz, and 1 MHz. Etching may also be performed using a high bias in pulses to effectively remove the metal-doped carbon-containing material. An example of a high bias is a bias having a power of at least about 1000V applied to the pedestal during etch. The use of a bias depends on the chemistry and whether directional etching is used in the application of using certain disclosed embodiments. If a bias is applied, the power applied to the bias may be between about 10V and about 3000V, such as about 10V. It will be understood that the terms "bias power" and "bias voltage" are used interchangeably herein to describe the voltage for which a pedestal is set when a bias is applied to the pedestal. Bias power or bias voltage as described herein is measured in watts for the power applied to the pedestal.

Pulsed bias may be used in some embodiments to prevent etching of the silicon-containing patterned mask. A pulsed plasma may be pulsed between a low and high bias, or between a bias in the ON state and a bias in the OFF state (0V) state. Pulsing between a low bias and a high bias involves pulsing between a low bias between about 100V and about 300V and a high bias between about 1000V and about 2500V. Pulsing may be performed using a duty cycle between about 3% and about 40%, or about 3% to about 99%, or 100% (continuous bias). Duty cycle refers to the duration the pulse is on during a period. It will be understood that bias pulsing may involve repetitions of periods, each of which may last a duration T. The duration T includes the duration for pulse ON time (the duration for which the bias is in an ON state) and the duration for bias OFF time (the duration from which the bias is in an OFF state) during a given period. The pulse frequency will be understood as 1/T. For example, for a bias pulsing period T=100 μs, frequency is 1/T=1/100 μs, or 10 kHz. The duty cycle or duty ratio is the fraction or percentage in a period T during which the bias is in the ON state such that duty cycle or duty ratio is pulse ON time divided by T. For example, for a bias pulsing period T=100 μs, if a pulse ON time is 70 μs (such that the duration for which the bias is in an ON state in a period is 70 μs) and a pulse OFF time is 30 μs (such that the duration for which the bias is in an OFF state in a period is 30 μs), the duty cycle is 70%.

Figure 3C:
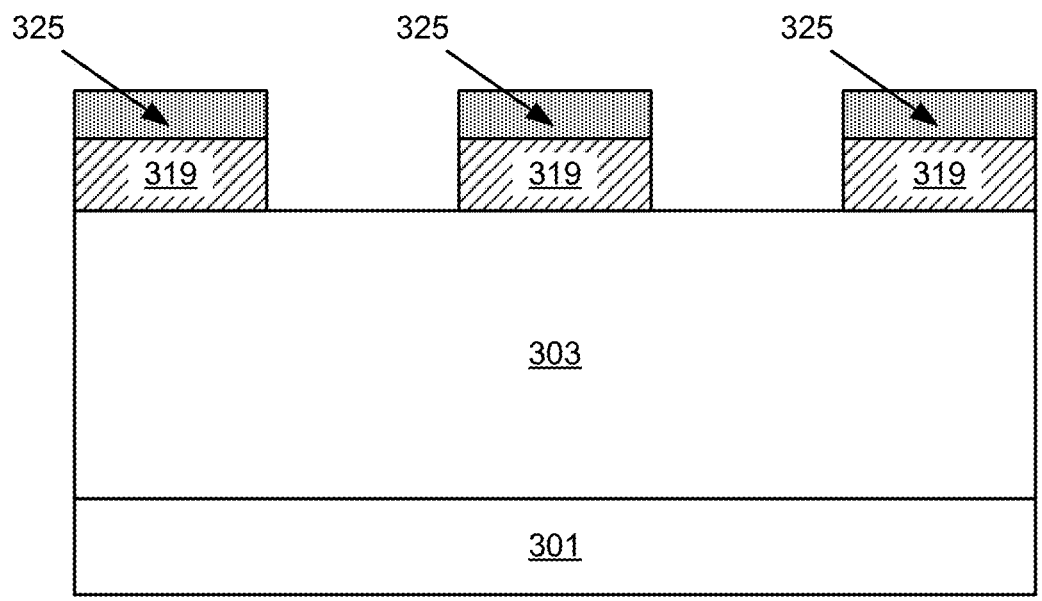

As shown, in FIG. 3C the metal-doped carbon-containing layer 309 in FIG. 3B is etched selectively relative to the patterned mask such as an SiON mask to form patterned metal-doped carbon-containing mask 319. In some embodiments, etching is selective only to the patterned mask and not the amorphous carbon 303 such that some amorphous carbon 303 may be etched. However, since such etching may be fairly slow, such etching is not used to fully etch the entire amorphous carbon layer and another etching chemistry, further described below, is used to etch the thickness of the amorphous carbon layer. Note that since etching is performed using the patterned mask 325 as a mask, the aspect ratio of the gaps between the features remains the same. The etching chemistry is selective to etch largely the metal-doped carbon-containing layer 309, without etching the patterned mask 325 and without substantially etching the amorphous carbon 303. In some embodiments, some very little amount of patterned mask 325 may be consumed during this operation. The etching chemistry includes a halogen-containing chemistry. The etch selectivity of the metal-doped carbon-containing layer relative to the carbon material may be at least about 10:1, or between about 30:1 and about 40:1.

In various embodiments, after the metal-doped carbon-containing mask 319 is patterned, the patterned mask 325 is optionally removed using a fluorocarbon chemistry to eliminate the presence of silicon prior to operation 209, which is further described below.

Returning to FIG. 2, in operation 209, the pattern is then transferred to the carbon material using the metal-doped carbon-containing mask as a mask. Etching may be performed using an oxygen-containing gas mixed with a sulfur dioxide or carbon oxysulfide gas, and one or more inert gases such as nitrogen, argon, and helium. During etch, where the patterned mask 325 is removed prior to transferring the pattern to the carbon material, no silicon is present during etching such that there is no redeposition or formation of silicon-containing residues.

Figure 3D:
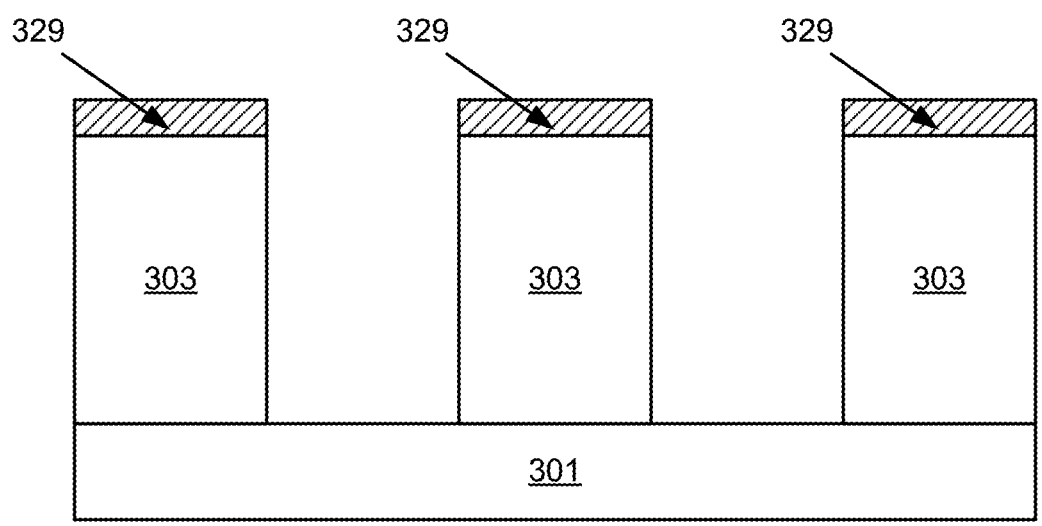

FIG. 3D shows a substrate 301 with patterned carbon layer 313 etched using the patterned mask 325, which has been consumed, and metal-doped carbon-containing mask 329 as a mask. Since the thicker silicon-containing patterned mask is no longer used due to use of the metal-doped carbon-containing mask, the amount of silicon-containing residues left at the tops of the features is reduced or, in some embodiments, completely eliminated.

Returning to FIG. 2, in various embodiments, operations 205-209 may be performed in situ. In some embodiments, operations 205-209 are performed without breaking vacuum. In some embodiments, operations 205-209 are performed in the same chamber.

Apparatus

Disclosed embodiments may be performed in any suitable etching chamber or apparatus, available from Lam Research Corporation of Fremont, Calif. Further description of plasma etch chambers may be found in U.S. Pat. Nos. 6,841,943 and 8,552,334, which are herein incorporated by reference in their entireties.

Disclosed embodiments are performed in an inductively coupled plasma (ICP) reactor. One example is provided in FIG. 4. Such ICP reactors have also been described in U.S. Pat. No. 9,362,133 issued Jun. 7, 2016, filed Dec. 10, 2013, and titled "METHOD FOR FORMING A MASK BY ETCHING CONFORMAL FILM ON PATTERNED ASHABLE HARDMASK," hereby incorporated by reference for the purpose of describing a suitable ICP reactor for implementation of the techniques described herein. Although ICP reactors are described herein, in some embodiments, it should be understood that capacitively coupled plasma reactors may also be used. An example chamber or apparatus may include a chamber having chamber walls, a chuck for holding a substrate or wafer to be processed which may include electrostatic electrodes for chucking and dechucking a wafer and may be electrically charged using a radio frequency (RF) power supply, an RF power supply configured to supply power to a coil to generate a plasma, and gas flow inlets for inletting gases as described herein. In some embodiments, an apparatus may include more than one chamber, each of which may be used to etch, deposit, or process substrates. The chamber or apparatus may include a system controller for controlling some or all of the operations of the chamber or apparatus such as modulating chamber pressure, inert gas flow, plasma power, plasma frequency, reactive gas flow (e.g., etching gas, etc.), bias power, temperature, vacuum settings, and other process conditions. The chamber may also be used to deposit carbon-containing material onto a substrate.

Figure 4:
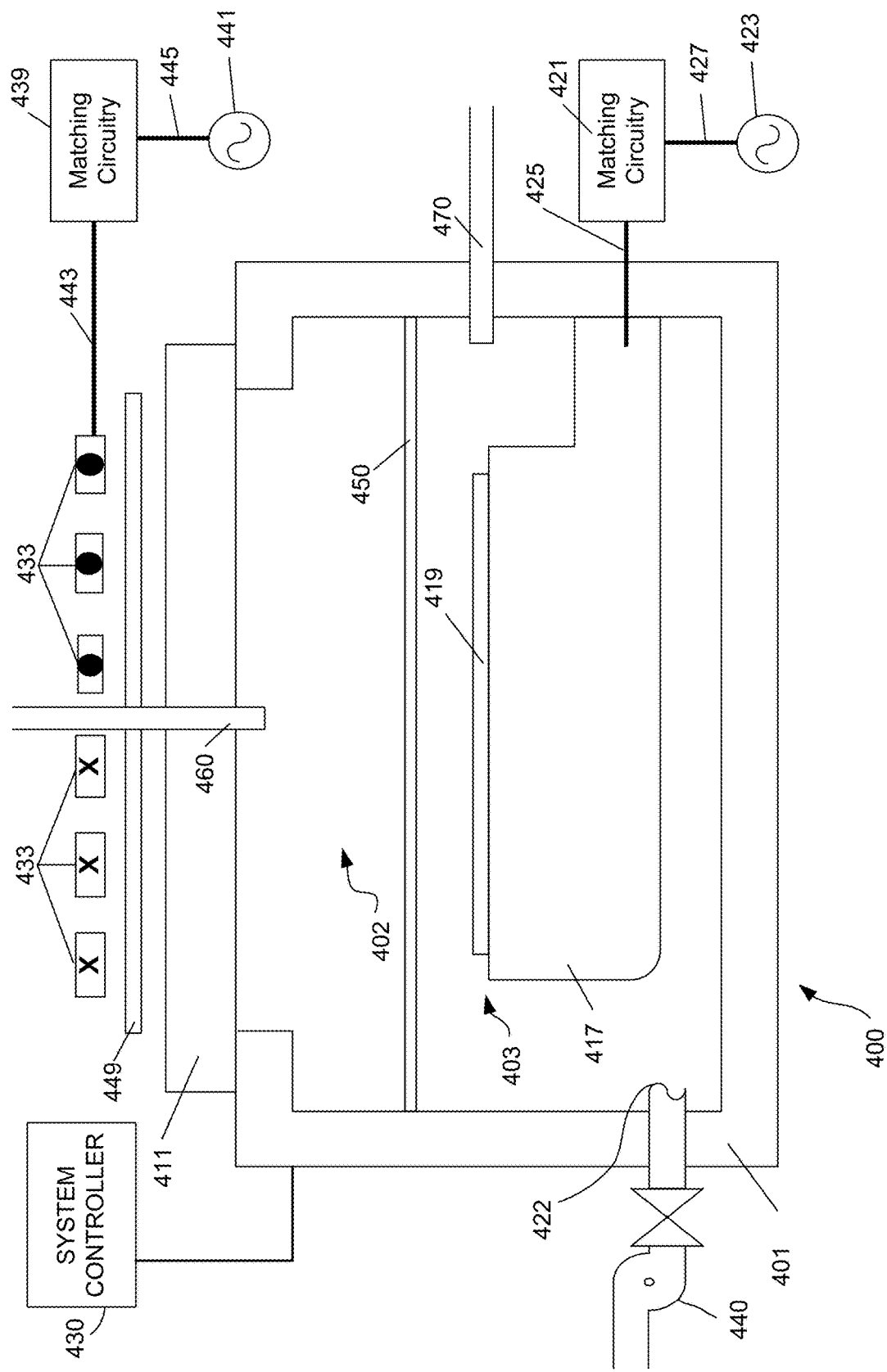
FIG. 4 is a schematic diagram of an example process chamber for performing certain disclosed embodiments.

FIG. 4 schematically shows a cross-sectional view of an inductively coupled plasma integrated etching and deposition apparatus 400 appropriate for implementing certain embodiments herein, an example of which is an inductively coupled plasma reactor, produced by Lam Research Corp. of Fremont, Calif. The inductively coupled plasma apparatus 400 includes a processing chamber 401 structurally defined by chamber walls and a window 411. The chamber walls may be fabricated from stainless steel or aluminum. The window 411 may be fabricated from quartz or other dielectric material. An optional internal showerhead 450 divides the processing chamber 401 into an upper sub-chamber 402 and a lower sub-chamber 403. The showerhead may include one hole, or may include multiple holes for delivering and distributing gases and/or plasma species to lower sub-chamber 403. In most embodiments, showerhead 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor wafer 419 upon which the etching and deposition processes are performed. The chuck 417 can be an electrostatic chuck for supporting the wafer 419 when present. In some embodiments, an edge ring (not shown) surrounds chuck 417, and has an upper surface that is approximately planar with a top surface of a wafer 419, when present over chuck 417. The chuck 417 also includes electrostatic electrodes for chucking and dechucking the wafer. A filter and DC clamp power supply (not shown) may be provided for this purpose. Other control systems for lifting the wafer 419 off the chuck 417 can also be provided. The chuck 417 may be movable along an axis substantially parallel to the sidewalls of the chamber whereby the surface of the chuck 417 is substantially parallel to the ground. If a showerhead is used, the distance between the wafer 419 and the showerhead (not shown) may be between about 0.5 inches and about 3.0 inches. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417.

Elements for plasma generation include a coil 433 is positioned above window 411. In various embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "●" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449 is positioned between the coil 433 and the window 411. The Faraday shield 449 is maintained in a spaced apart relationship relative to the coil 433. The Faraday shield 449 is disposed immediately above the window 411. The coil 433, the Faraday shield 449, and the window 411 are each configured to be substantially parallel to one another. The Faraday shield may prevent metal or other species from depositing on the dielectric window of the processing chamber 401.

Process gases (e.g. oxygen-containing gases, halogen-containing gases, metal-doped carbon-containing layer deposition precursors, etc.) may be flowed into the processing chamber 401 through one or more main gas flow inlets 460 positioned in the upper chamber 402 and/or through one or more side gas flow inlets 470. Likewise, though not explicitly shown, similar gas flow inlets may be used to supply process gases to a capacitively coupled plasma processing chamber. A vacuum pump, e.g., a one or two stage mechanical dry pump and/or turbomolecular pump 440, may be used to draw process gases out of the processing chamber 401 and to maintain a pressure within the processing chamber 401. For example, the pump may be used to evacuate the processing chamber 401 to remove volatile by-products generated from etching metal-doped carbon-containing material and undoped carbon-containing material as well as patterned mask material such as SiON material. A valve-controlled conduit may be used to fluidically connect the vacuum pump to the processing chamber 401 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced more complex gas flow inlets, one or more showerheads, for example. The Faraday shield 449 and/or optional grid 450 may include internal channels and holes that allow delivery of process gases to the processing chamber 401. Either or both of Faraday shield 449 and optional grid 450 may serve as a showerhead for delivery of process gases. In some embodiments, a liquid vaporization and delivery system may be situated upstream of the processing chamber 401, such that once a liquid reactant or precursor is vaporized, the vaporized reactant or precursor is introduced into the processing chamber 401 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 selectively etch features of and deposit layers on the wafer.

If the plasma grid is used such that there is both an upper sub-chamber 402 and a lower sub-chamber 403, the inductive current acts on the gas or gases present in the upper sub-chamber 402 to generate an electron-ion plasma in the upper sub-chamber 402. The optional internal plasma grid 450 limits the amount of hot electrons in the lower sub-chamber 403. In some embodiments, the apparatus is designed and operated such that the plasma present in the lower sub-chamber 403 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 403 through port 422. The chuck 417 disclosed herein may operate at elevated temperatures ranging between about 200° C. and about 500° C. The temperature will depend on the process operation and specific recipe.

Processing chamber 401 may be coupled to facilities (not shown) when installed in a clean room or a fabrication facility. Facilities include plumbing that provide processing gases, vacuum, temperature control, and environmental particle control. These facilities are coupled to processing chamber 401, when installed in the target fabrication facility. Additionally, processing chamber 401 may be coupled to a transfer chamber that allows robotics to transfer semiconductor wafers into and out of processing chamber 401 using typical automation.

In some embodiments, a system controller 430 (which may include one or more physical or logical controllers) controls some or all of the operations of a processing chamber. The system controller 430 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

The processing chamber 401 or apparatus may include a system controller. For example, in some embodiments, a controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 430, depending on the processing specification and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 430, in some implementations, may be a part of or coupled to a computer that is integrated with, coupled to the system, otherwise networked to the system, or a combination thereof. For example, the controller 430 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 430 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5:
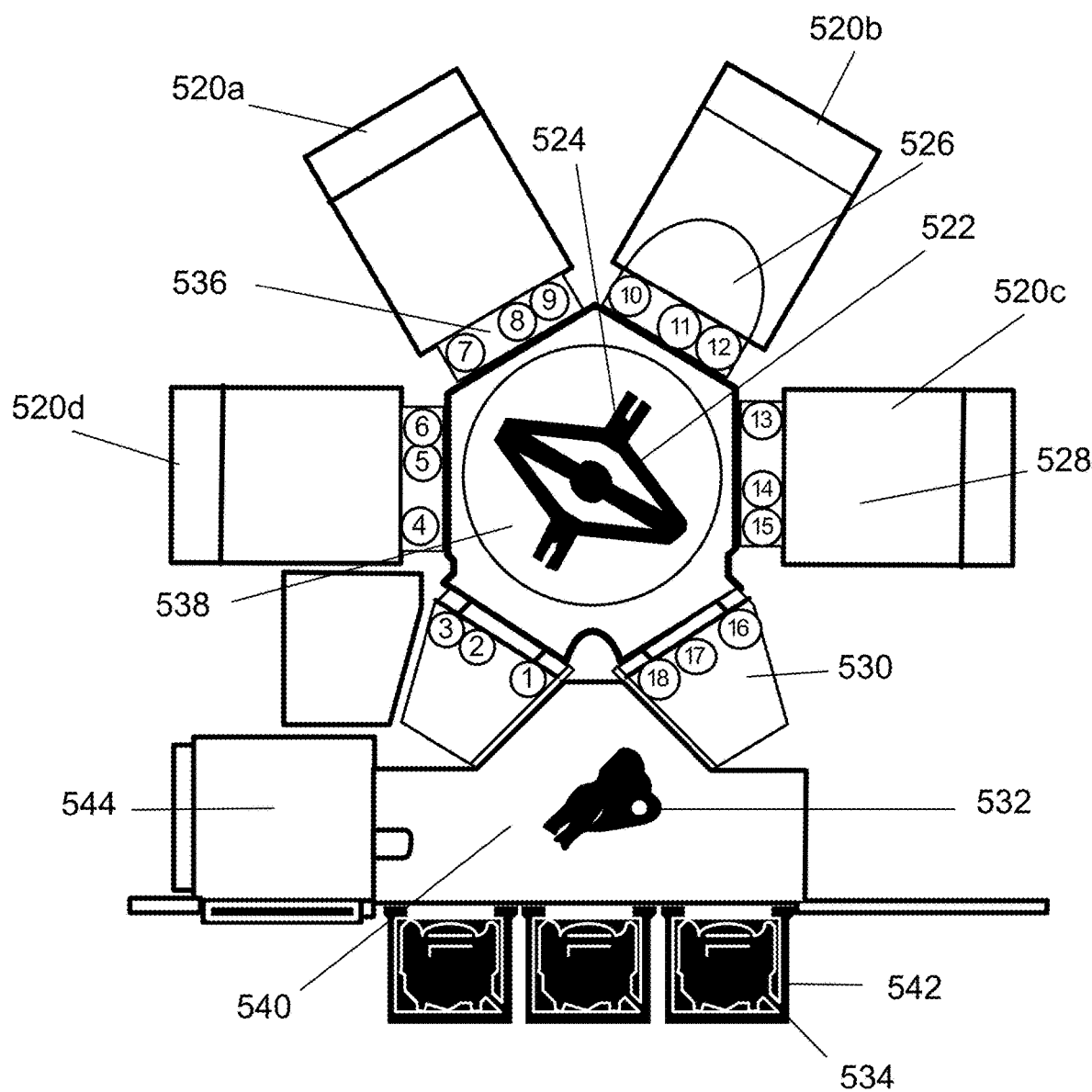
FIG. 5 is a schematic diagram of an example process apparatus for performing certain disclosed embodiments.

The processing chamber 401 may be integrated in a multi-station tool such as shown in FIG. 5. Each station may be used to process different operations. For example, one station may be used to perform pre-oxidation while another station is used to perform selective etching of the metal-doped carbon-containing material. Disclosed embodiments may be performed without breaking vacuum and may be performed in the same apparatus.

FIG. 5 depicts a semiconductor process cluster architecture with various modules that interface with a vacuum transfer module (VTM) 538. The arrangement of transfer modules to "transfer" wafers among multiple storage facilities and processing modules may be referred to as a "cluster tool architecture" system. Airlock 530, also known as a loadlock or transfer module, is shown in VTM 538 with four processing modules 520a-520d, which may be individual optimized to perform various fabrication processes. By way of example, processing modules 520a-520d may be implemented to perform substrate etching, deposition, ion implantation, wafer cleaning, sputtering, and/or other semiconductor processes. One or more of the substrate etching processing modules (any of 520a-520d) may be implemented as disclosed herein, i.e., for performing pre-oxidation, selectively removing metal-doped carbon-containing material, and other suitable functions in accordance with the disclosed embodiments. Airlock 530 and process module 520 may be referred to as "stations." Each station has a facet 536 that interfaces the station to VTM 538. Inside each facet, sensors 1-18 are used to detect the passing of wafer 526 when moved between respective stations.

Robot 522 transfers wafer 526 between stations. In one embodiment, robot 522 has one arm, and in another embodiment, robot 522 has two arms, where each arm has an end effector 524 to pick wafers such as wafer 526 for transport. Front-end robot 532, in atmospheric transfer module (ATM) 540, is used to transfer wafers 526 from cassette or Front Opening Unified Pod (FOUP) 534 in Load Port Module (LPM) 542 to airlock 530. Module center 528 inside process module 520 is one location for placing wafer 526. Aligner 544 in ATM 540 is used to align wafers.

In an exemplary processing method, a wafer is placed in one of the FOUPs 534 in the LPM 542. Front-end robot 532 transfers the wafer from the FOUP 534 to an aligner 544, which allows the wafer 526 to be properly centered before it is etched or processed. After being aligned, the wafer 526 is moved by the front-end robot 532 into an airlock 530. Because airlock modules have the ability to match the environment between an ATM and a VTM, the wafer 526 is able to move between the two pressure environments without being damaged. From the airlock module 530, the wafer 526 is moved by robot 522 through VTM 538 and into one of the process modules 520a-520d. In order to achieve this wafer movement, the robot 522 uses end effectors 524 on each of its arms. Once the wafer 526 has been processed, it is moved by robot 522 from the process modules 520a-520d to an airlock module 530. From here, the wafer 526 may be moved by the front-end robot 532 to one of the FOUPs 534 or to the aligner 544.

The computer controlling the wafer movement can be local to the cluster architecture, or can be located external to the cluster architecture in the manufacturing floor, or in a remote location and connected to the cluster architecture via a network. A controller as described above with respect to FIG. 4 may be implemented with the tool in FIG. 5.

Experimental

Figure 6:
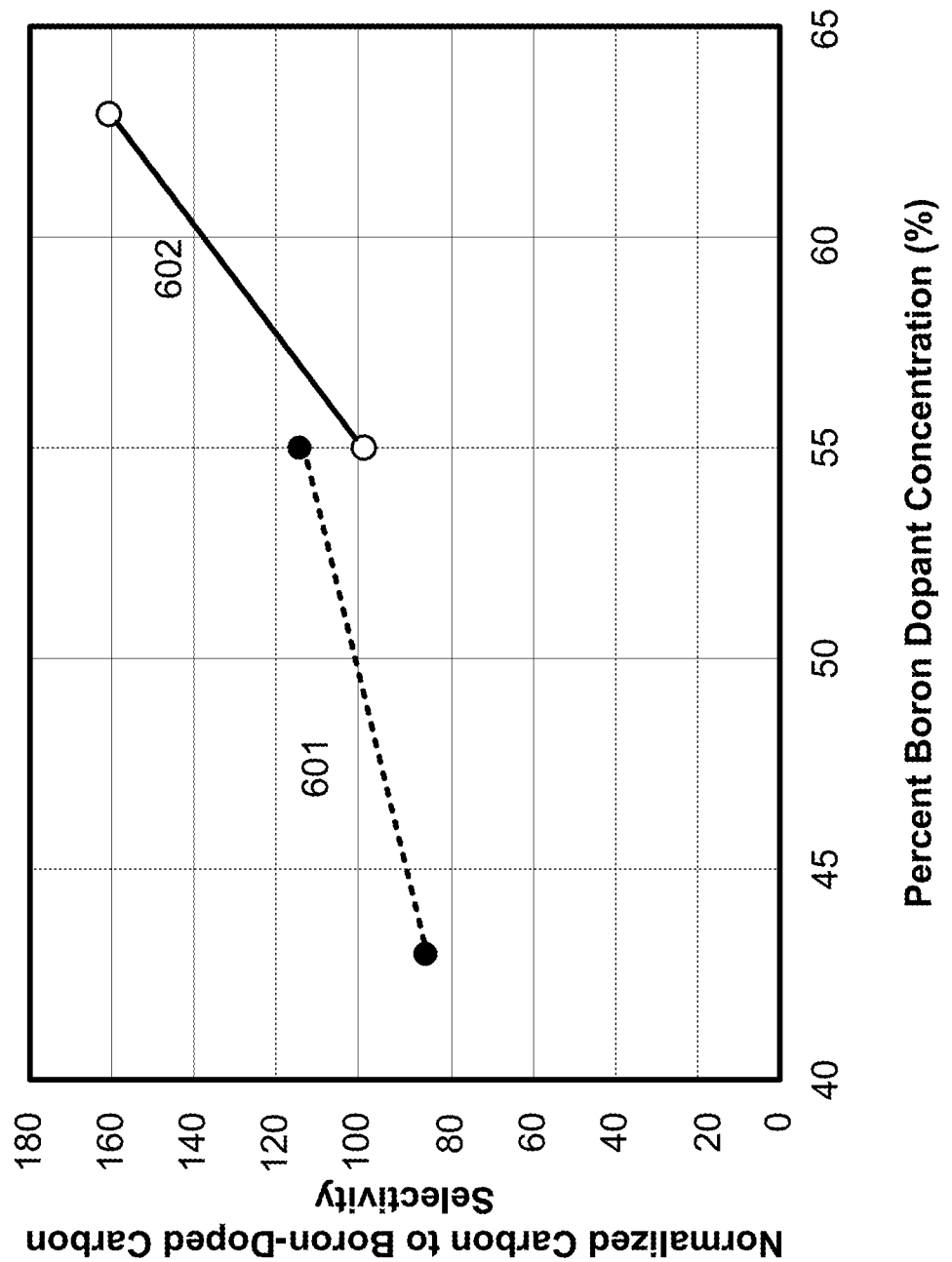
FIG. 6 is a graph depicting etch selectivity versus boron concentration of boron-doped carbon material in an experiment performed in accordance with certain disclosed embodiments.

An experiment was conducted on two substrates having boron-doped carbon having different boron dopant concentrations. Undoped carbon was etched relative to these boron-doped carbon material, and the etch selectivity was measured and normalized. The two substrates were exposed to different temperatures, the difference between the temperatures being 100° C. The results are shown in FIG. 6 in graph 601 for a first substrate and graph 602 for the second; the general trend shown in both substrates is depicted. As boron dopant concentration increases, carbon to boron-doped carbon selectivity increases.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a substrate comprising a substantially dopant-free amorphous carbon layer to be etched;
forming a patterned silicon-free doped carbon-containing layer over the substantially dopant-free amorphous carbon layer; and
prior to etching the substantially dopant-free amorphous carbon layer, completely removing a silicon-containing patterned mask;
etching the substantially dopant-free amorphous carbon layer in a silicon-free environment using the patterned silicon-free doped carbon-containing layer to form a patterned substantially dopant-free amorphous carbon layer by introducing an oxygen-containing chemistry to etch the substantially dopant-free amorphous carbon layer,
wherein the substantially dopant-free amorphous carbon layer has a modulus between about 60 GPa and about 160 GPa, and
wherein etching the substantially dopant-free amorphous carbon layer comprises forming features in the patterned substantially dopant-free amorphous carbon layer having an ellipticity of between about 0.67 and about 1.03.

2. The method of claim 1, wherein the patterned silicon-free doped carbon-containing layer is silicon-free.

3. The method of claim 1, wherein forming the patterned silicon-free doped carbon-containing layer comprises forming a patterned mask on a doped carbon-containing layer and etching the doped carbon-containing layer using the patterned mask to form the patterned silicon-free doped carbon-containing layer.

4. The method of claim 3, further comprising prior to etching the substantially dopant-free amorphous carbon layer, removing the patterned mask.

5. The method of claim 3, wherein the patterned mask comprises silicon.

6. The method of claim 5, wherein the patterned mask comprises silicon oxycarbide or silicon oxynitride.

7. The method of claim 3, wherein ratio of thickness of the patterned mask to thickness of the doped carbon-containing layer is between about 1:5 and about 1:7.

8. The method of claim 3, wherein the etching of the substantially dopant-free amorphous carbon layer consumes substantially all of the patterned mask.

9. The method of claim 3, wherein the patterned mask is formed by depositing a mask material over the doped carbon-containing layer, developing a patterned resist over the mask material, and etching the mask material relative to the doped carbon-containing layer using the patterned resist.

10. The method of claim 1, wherein the patterned silicon-free doped carbon-containing layer comprises a dopant selected from the group consisting of boron, titanium, tungsten, tantalum, tin, aluminum, and combinations thereof.

11. The method of claim 1, wherein forming the patterned silicon-free doped carbon-containing layer comprises forming features having feature openings with a width between about 16 nm and about 120 nm.

12. The method of claim 1, wherein etch rate of the substantially dopant-free amorphous carbon layer during the etching of the substantially dopant-free amorphous carbon layer is at least about three times faster than etch rate on the patterned silicon-free doped carbon-containing layer.

13. The method of claim 1, wherein ratio of thickness of the patterned silicon-free doped carbon-containing layer to thickness of the substantially dopant-free amorphous carbon layer is between about 1:5 and about 1:8.

14. The method of claim 1, wherein the etching of the patterned silicon-free doped carbon-containing layer is performed using a bias.

15. The method of claim 1, wherein the etching is performed using one or more gases that form volatile byproducts with the patterned silicon-free doped carbon-containing layer and the substantially dopant-free amorphous carbon layer without redepositing material onto substrate surfaces.

16. The method of claim 1, wherein the patterned silicon-free doped carbon-containing layer is doped with boron and the etching of the substantially dopant-free amorphous carbon layer is performed in a silicon-free environment.

17. The method of claim 1, wherein the substantially dopant-free amorphous carbon layer has a thickness between about 50 nm and about 120 nm.

18. The method of claim 1, wherein the substantially dopant-free amorphous carbon layer comprises between about 15% and about 50% sp3 bonds.

* * * * *